United States Patent [19]
Yao

[11] Patent Number: 5,838,204
[45] Date of Patent: Nov. 17, 1998

[54] PHASE LOCKED LOOP WITH MULTIPLE, PROGRAMMABLE, OPERATING FREQUENCIES, AND AN EFFICIENT PHASE LOCKED LOOP LAYOUT METHOD

[75] Inventor: Chingchi Yao, Saratoga, Calif.

[73] Assignee: Oki America, Inc., Hackensack, N.J.

[21] Appl. No.: 712,337

[22] Filed: Sep. 11, 1996

[51] Int. Cl.$^6$ ................................................. H03L 7/00
[52] U.S. Cl. ........................... 331/1 R; 331/175; 327/156
[58] Field of Search ................................ 331/1 A, 34, 57, 331/177 R, 179, 175, 108 C, 25, 1 R; 327/156–159, 276–278, 281; 375/376

[56] References Cited

U.S. PATENT DOCUMENTS

| | | | |
|---|---|---|---|
| 4,517,532 | 5/1985 | Neidorff | 331/57 |
| 4,584,695 | 4/1986 | Wong et al. | 331/45 X |
| 5,075,640 | 12/1991 | Miyazawa | 331/34 X |
| 5,117,206 | 5/1992 | Imamura | 331/179 X |
| 5,382,921 | 1/1995 | Estrada et al. | 331/57 X |
| 5,389,898 | 2/1995 | Taketoshi et al. | 331/57 X |
| 5,479,457 | 12/1995 | Waters | 375/376 X |

*Primary Examiner*—David Mis
*Attorney, Agent, or Firm*—Townsend and Townsend and Crew LLP

[57] ABSTRACT

An application specific integrated circuit (ASIC) including a phase-locked loop (PLL) circuit operably coupled to an internal clock and an external clock. The present PLL circuit includes an internal phase detector circuit, an internal charge pump operably coupled to the phase detector circuit, a loop filter operably coupled to the charge pump, and an internal programmable voltage-controlled oscillator 200, 300. The internal programmable voltage controlled oscillator includes a plurality of delay elements, which have a respective switch to turn-on the delay elements. A storage device having a plurality of outputs providing selected switch signals to the voltage oscillator program one of a plurality of center frequencies. Each of the outputs is operably coupled respectively to the delay elements through the respective switch. The switch isolates a first group of delay elements from a second group of delay elements. Setting simultaneous operating (SSO) limits for an application specific integrated circuit (ASIC) having a phase-locked loop sets a limit for the PLL pins.

10 Claims, 12 Drawing Sheets

PHASE LOCKED LOOP WITH MULTIPLE, PROGRAMMABLE, OPERATING FREQUENCIES, AND AN EFFICIENT PHASE LOCKED LOOP LAYOUT METHOD

BACKGROUND OF THE INVENTION

The present invention relates to semiconductor integrated circuits and the design therefor. The invention is illustrated in an example with regard to a phase-locked loop for use as an on-chip clock in an application specific integrated circuit (ASIC), but it will be recognized that the invention has a wider range of applicability. Merely by way of example, the invention may be applied in other semiconductor integrated circuits such as standard IC products, among others.

A phase-locked loop (PLL) for use as an on-chip clock generator is generally known in the art. A conventional PLL generates an internal clock whose frequency is an integral-multiple of an external clock frequency. The conventional PLL includes elements of at least a phase detector, a voltage-controlled oscillator (VCO), a loop filter, and a frequency divider. These elements create a system that uses feedback to maintain an output clock signal in a specific phase relationship with a reference clock signal. A charge pump which is essentially an integrator is an averaging device used simultaneously to implement the loop filter may also be used. An example of such PLL is described in detail in a paper entitled "A PROGRAMMABLE CLOCK GENERATOR WITH 50 TO 350 MHz LOCK RANGE FOR VIDEO SIGNAL PROCESSORS" published at a 1993 IEEE Custom Integrated Circuits Conference by NEC Corporation, which is hereby incorporated by reference for all purposes.

A limitation with this type of conventional PLL is that the selected switch signals are often difficult to program into the VCO. In fact, the conventional PLL often relies upon an input such as a signal from a conventional logic decoder to provide a selected signal to an adjustable VCO unit. The type of input signals entering the conventional logic decoder, and exiting the conventional logic decoder are often fixed, and difficult to change from application-to-application. Another limitation with the conventional PLL is limited storage capability. A conventional logic decoder simply has no storage capability at all. Accordingly, almost no flexibility exists for programmability and storage of selected switch signals on the conventional PLL.

A further limitation with the conventional PLL is excessive noise. For example, the conventional PLL includes a charge pump which is often "noisy" and interferes with other circuit elements such as a VCO and the like. The noise from the charge pump often causes detrimental effects such as improper switching, large phase jitters, and the like, thereby limiting the use of such conventional charge pump in the PLL.

Still a further limitation is noise caused by way of simultaneous switching of output buffers (SSO). During output switching, a large current spike often occurs when two output buffers turn-on. A large capacitance load current is also drawn by a switching output during simultaneous switching of multiple output buffers. Multiple output buffers switching simultaneously create large noise at the $V_{DD}$ and $V_{SS}$ lines or pads. When the noise is large enough, a driven logic misinterprets an output waveform. Noise from the output buffers also cause other detrimental effects such as PLL frequency jitters, and the like.

From the above it is seen that a method and structure for providing a programmable, efficient PLL type device in a semiconductor integrated circuit such as an ASIC are clearly desired.

SUMMARY OF THE INVENTION

The present invention provides a method and resulting structure for an integrated circuit. In particular, the present structure includes a programmable PLL circuit with an adjustable voltage-controlled oscillator. The voltage controlled-oscillator receives control signals from a storage device such as a shift register, a memory device, and the like.

In a specific embodiment, the present invention provides an application specific integrated circuit (ASIC) which includes a phase-locked loop (PLL) circuit operably coupled to a clock signal used to provide an internal clock signal. The present PLL circuit includes an internal phase detector circuit operably coupled to an external clock signal, an internal charge pump operably coupled to the phase detector circuit, and a loop filter operably coupled to the charge pump. An internal programmable voltage-controlled oscillator (VCO) producing an internal clock signal is also included. The present VCO includes a plurality of delay elements, each including a switch to turn-on each delay element. A storage device having a plurality of outputs is also included. Each of the outputs is operably coupled to each delay element, respectively, through its switch. The storage device also provides selected switch signals via said plurality of outputs to produce the internal clock signal.

An alternative specific embodiment provides a method for setting simultaneous switching operating (SSO) limits for an application specific integrated circuit (ASIC) which includes a phase-locked loop (PLL) therein. The present method includes steps of defining a first set of pins adjacent to a PLL circuit in an ASIC and defining a second set of pins adjacent to the first set of pins. A step of setting a first SSO current limit for each of the first set of pins and setting a second SSO current limit for each of the second set of pins is also included. In the embodiment, the first SSO current limit is less than the second SSO current limit.

Still a further embodiment provides another application specific integrated circuit (ASIC) comprising a phase-locked loop (PLL) circuit operably coupled to an external clock, which provides an internal clock. The PLL has a phase detector circuit operably coupled to an external clock signal, a charge pump operably coupled to the phase detector circuit, and a loop filter operably coupled to the charge pump. An internal programmable voltage-controlled oscillator (VCO), which includes a plurality of delay elements is included. Each of the delay elements is connected to each other in series, and includes a voltage controlled inverter having an output connected to a common line. The common line connects an output of each of the voltage controlled oscillators together. A switch is connected between a first group of the voltage controlled inverters from a second group of the voltage controlled inverters to isolate the first group of the voltage controlled inverters from the second group of the voltage controlled inverters. By isolating these two groups of inverters from each other, the resulting delay loop does not get loaded down by the circuit elements from the voltage controlled inverters that are not being used, which improves VCO performance by decreasing the amount of noise and the like.

A further understanding of the nature and advantages of the present invention may be realized by reference to the latter portions of this specification and attached drawings.

DESCRIPTION OF SPECIFIC EMBODIMENTS

Conventional PLL Circuit Diagram

Figure 1:
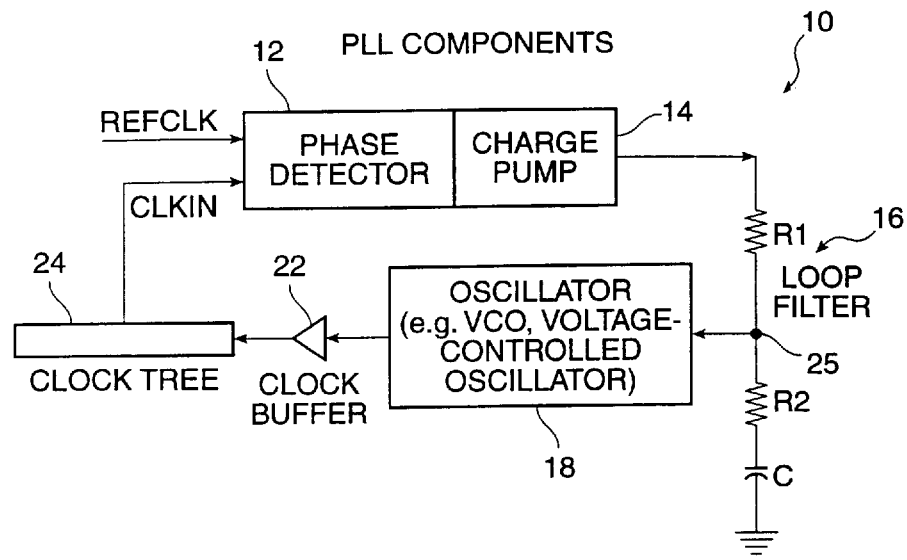
FIG. 1 is simplified block diagram of a conventional phase-locked loop.

FIG. 1 illustrates a simplified block diagram of a conventional phase-locked loop circuit 10. The phase locked loop circuit 10 includes a phase detector 12, a charge pump 14, a loop filter 16, and an oscillator 18. A clock driver 22, a frequency divider (not shown), and a delay compensation buffer (not shown) may also be available for particular applications. Also shown are a reference clock signal REFCLK, a clock-in signal CLKIN, and a clock tree 24. The loop filter 16 shapes an overall response of the PLL to meet the design goals of the system. Examples of a conventional loop filter include a passive lag circuit and an active circuit. Both of such circuits produce a PLL with an overall second-order response characteristic.

FIG. 1 illustrates the conventional passive lag circuit version of the loop filter. The conventional passive lag circuit includes a resistor R1, a resistor R2, and a capacitor C, all outside the integrated circuit. The resistor R1, which is outside the integrated circuit, is coupled to the charge pump through an external pin. The resistor R1 is also coupled to a node 25 which couples to the VCO and the resistor R2 through another external pin. The resistor R2 also is coupled to the capacitor C, which is pulled down to a ground potential.

The oscillator is a conventional voltage controlled oscillator (VCO), typically designed for a single, specific center frequency with a relatively narrow frequency range. The VCO produces an AC output signal whose frequency is proportional to an input control voltage. The frequency range is often controlled by way of a biasing voltage of the loop filter.

Figure 2:
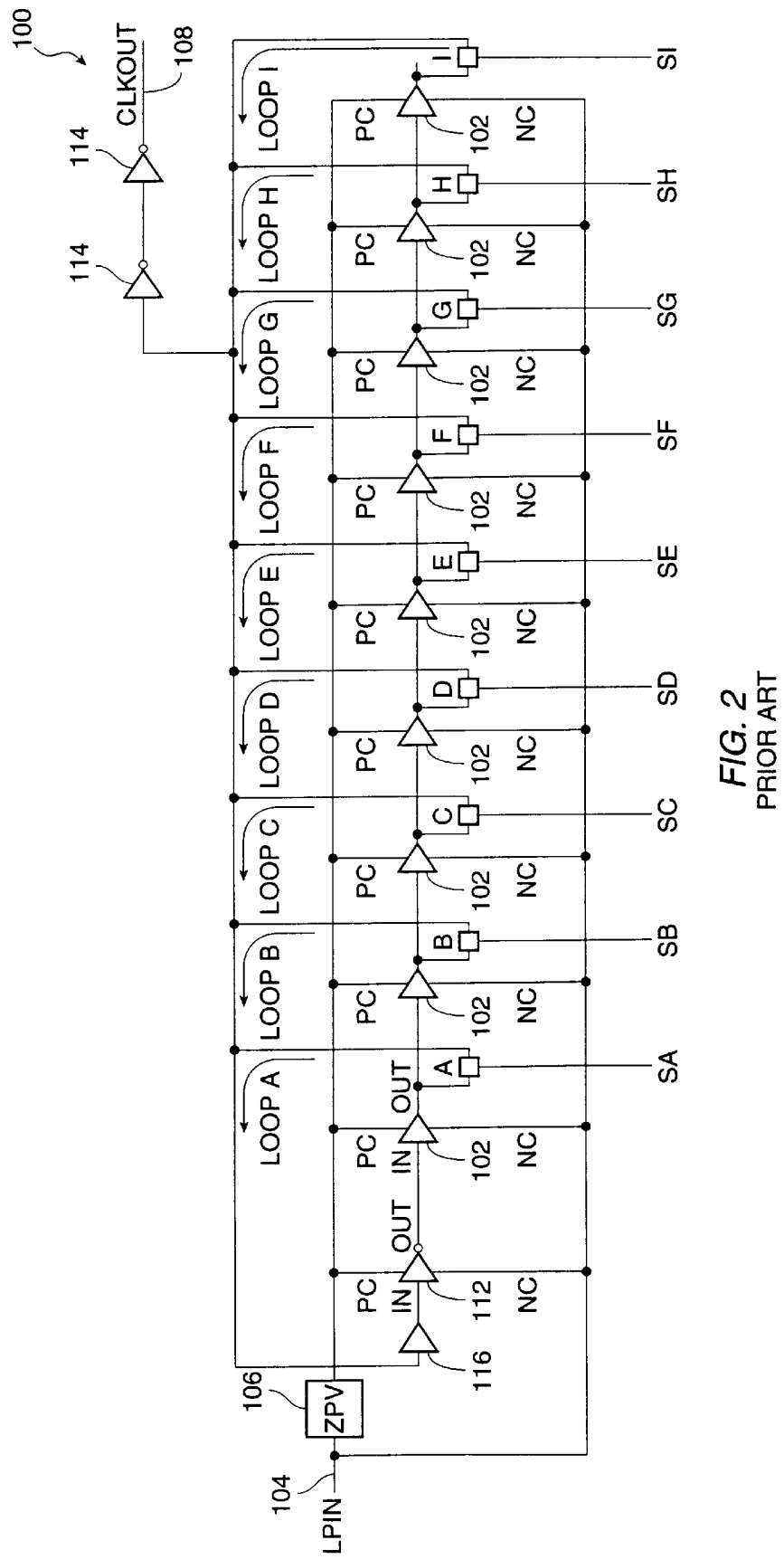
FIG. 2 is a simplified circuit diagram of a conventional phase-locked loop with adjustable operating frequencies.

A conventional VCO 100 can also be operable at multiple programmable frequencies, typically ranging from about 10 Hz to about 1,000 MHz as illustrated by FIG. 2. The VCO can be any suitable VCO with multiple, programmable frequencies. The VCO includes a ring oscillator with a plurality of delay element loops 102, typically enough to cover the lowest or highest desired frequency for the particular application. The VCO also includes an input LPIN 104 from a loop filter, a circuit 106 to separate voltage level to control gate delays, and a clock output CLKOUT 108. An inverting voltage controlled delay element 112, and buffers, both inverting 114 and non-inverting 116 are also shown.

The VCO includes a plurality of delay chains such as LOOP-A, LOOP-B, LOOP-C, . . . LOOP-I, among others. A respective signal is applied to each of the switches A, B, C, . . . I to close or open its respective loop. By way of the switches, a delay chain (or ring oscillator stage) is selected to create an effective loop which is suitable for a desired center oscillation frequency. For example, a selection of either LOOP-A, LOOP-B, or LOOP-C by way of SA, SB, or SC sets the PLL's center frequency to frequency A, frequency B, or frequency C.

The switches A, B, C, . . . I etc. can be any suitable type switch capable of receiving selected signals from a decoding means, such as an n-bit logic decoder. The n-bit logic decoder is a conventional type of decoding means to transmit selected signals to the VCO switches. As previously noted, the n-bit logic decoder includes numerous limitations.

In addition, the conventional VCO is susceptible to extreme noise from adjacent circuit elements, including metal lines. In particular, the delay chain includes numerous voltage controlled inverters, each connected in series to each other. These inverters tend to load down the circuit when unused for a particular loop. For instance, when loop A is selected. The remaining loops B, C, D, etc. are still connected to loop A, and therefore provides a loading factor to the loop A circuit. This causes parasitic noise and the like to the clock signal at loop A. During high frequency operation, these loading effects or noise can severely influence the derived clock signal from the VCO, therefore providing even more limitations.

Present PLL Circuit Embodiments

The present invention provides various embodiments used to provide selected switch signals to the VCO and other features. Some of these embodiments can provide these signals and reduce the amount of noise caused by adjacent circuit elements. These embodiments, however, are not intended to limit the scope of the claims. Of course, one of ordinary skill in the art would recognize other alternatives, variations, and modifications.

Figure 3A:
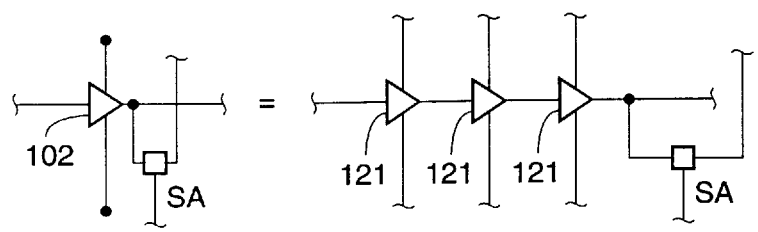
FIGS. 3 and 3A are simplified circuit diagrams of an m-bit shift register used to provide selected signals to an adjustable VCO according to the present invention.
Figure 3:
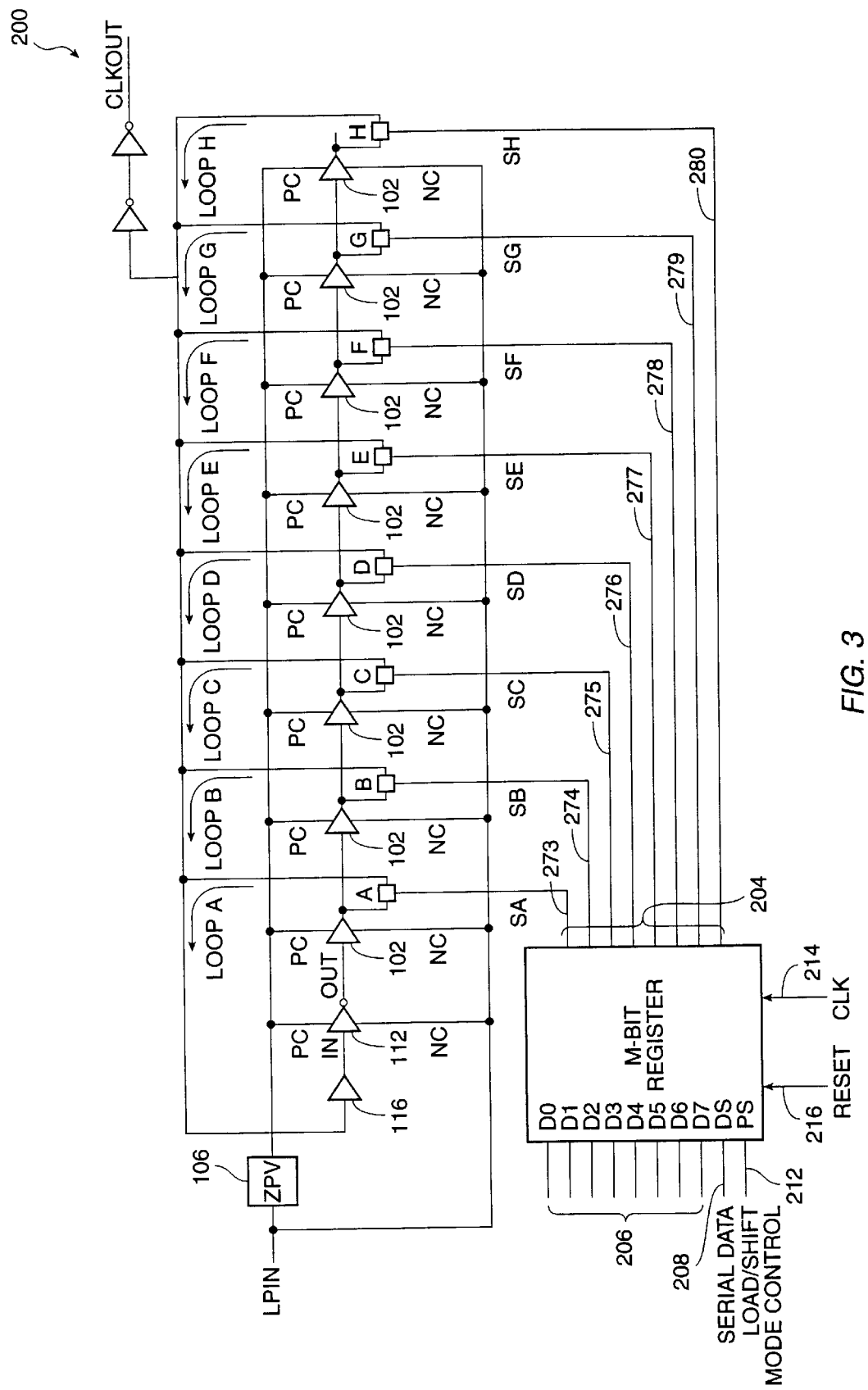

In a specific embodiment, an m-bit shift register 202 provides selected signals SA, SB, SC, . . . SH to the switches A, B, C, . . . H of the VCO 200 as illustrated by FIG. 3. As shown, outputs 204 of the shift register are connected to each of the switches A, B, C, . . . H, and provide respective switch signals SA, SB, SC, . . . SH therefor. The shift register also includes respective inputs D0 to D7 206, a serial data mode control 208, and a load/shift mode control 212. Also shown are a clock signal input 214 and a reset 216.

An input at D0 provides an output to line 273, which opens (e.g., connects lines coupled to switch A) switch A. By opening switch A, loop A is selected to provide a center frequency around loop A for the delay element chain. All other switches B, C, D . . . H remain closed. Similarly, inputs at D1, D2, D3, . . . D7 provide outputs to lines 274, 275, 276, . . . 280. As an example of a switching configuration, switch B is opened using a signal from line 274, all of the remaining switches are closed. This provides a center frequency around loop B for the delay element chain. Of course, other examples of the use of this delay element chain also can be easily made. The number of delay element chains also can be increased or decreased, depending upon the application.

The delay elements include any suitable voltage-controlled element 102 or the like. Examples of such voltage-controlled delay element include MOS, CMOS, bipolar buffers, and others. The voltage-controlled delay element includes an input, an output, a PC terminal, and an NC terminal. Gate delay for each voltage-controlled delay element is controlled by PC and NC. In addition, the delay element may also each comprise multiple delay elements as shown by FIG. 3A. For instance, to obtain the desired center frequency for a fixed transistor size, one voltage-controlled delay element can actually comprise more than one or a plurality of similarly sized voltage-controlled delay elements 121. Of course, the type and number of voltage-controlled delay elements depend upon the particular application.

The voltage-controlled inverter 112 can be any suitable type of voltage-controlled inverter such as MOS, CMOS, bipolar inverters, and others. The voltage-controlled inverter includes an input, an output, a PC terminal, and an NC terminal. Gate delay for each voltage-controlled delay element is controlled by PC and NC. Of course, the type of voltage-controlled inverter depends upon the particular application.

The circuit 106 to generate a voltage level to the control gate delays can be any suitable circuit which can provide such functions. Examples of such circuit include MOS, CMOS, bipolar, and others. Of course, the type of circuit depends upon the particular application.

Figure 4:
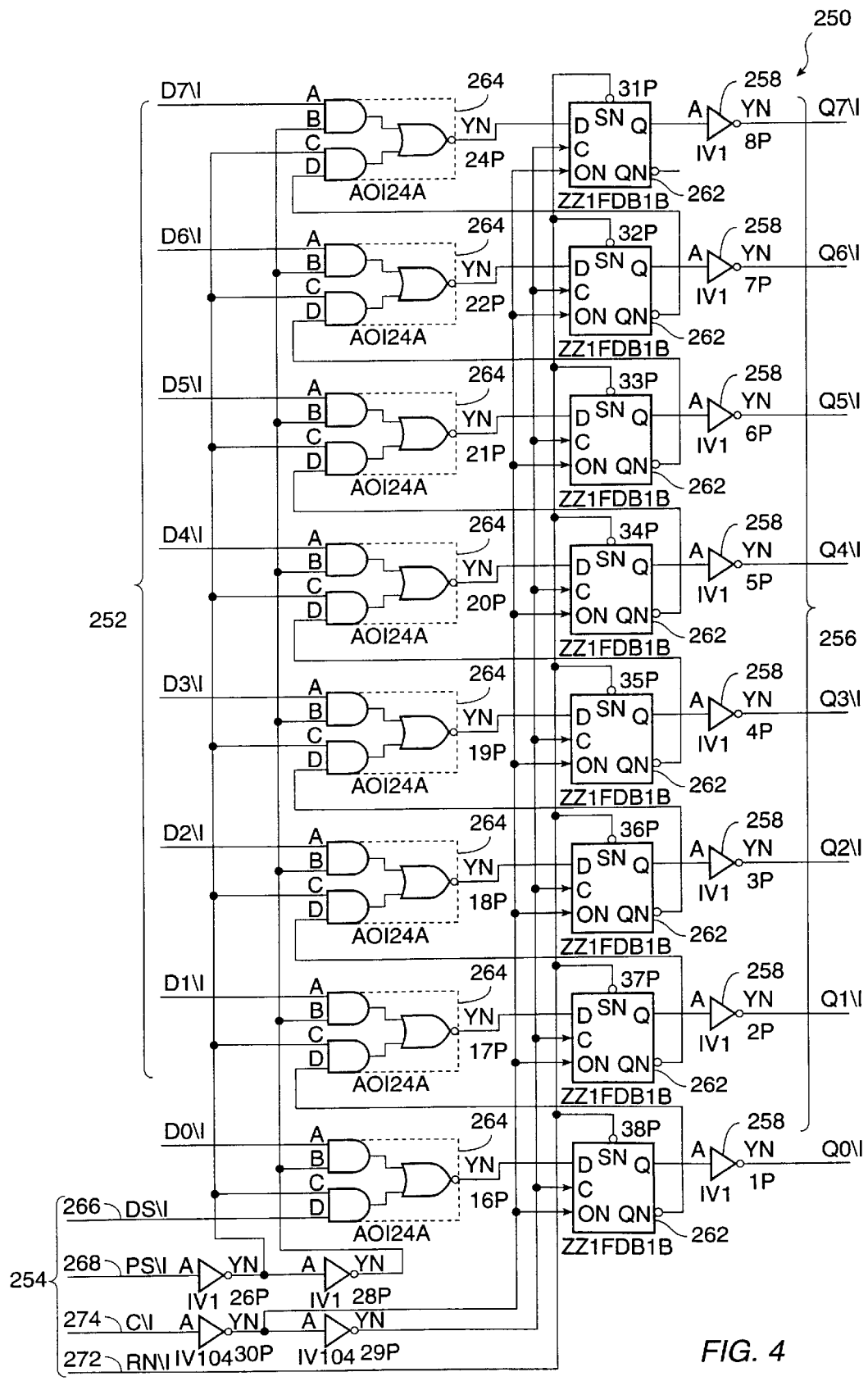
FIG. 4 is simplified circuit diagram of the m-bit shift register of FIG. 3.

An example of a shift register 250 is illustrated by a simplified circuit diagram of FIG. 4. The shift register 250 is an m-bit shift register, which includes data input lines 252, control lines 254, data output lines 256, output buffers 258, flip flops 262, a logic means 264, and other elements. The control lines 254 include a serial data mode control 266, a load/shift mode control 268, and a reset 272. Also shown is a terminal for a clock signal 274. The shift register may be operated in serial or parallel or any other suitable way for the particular application. For example, m-bit data are shifted or directly loaded into the shift register. Preferably, m is equal to and greater than the number of switches A, B, C, . . . H in the PLL delay chain.

Figure 5A:
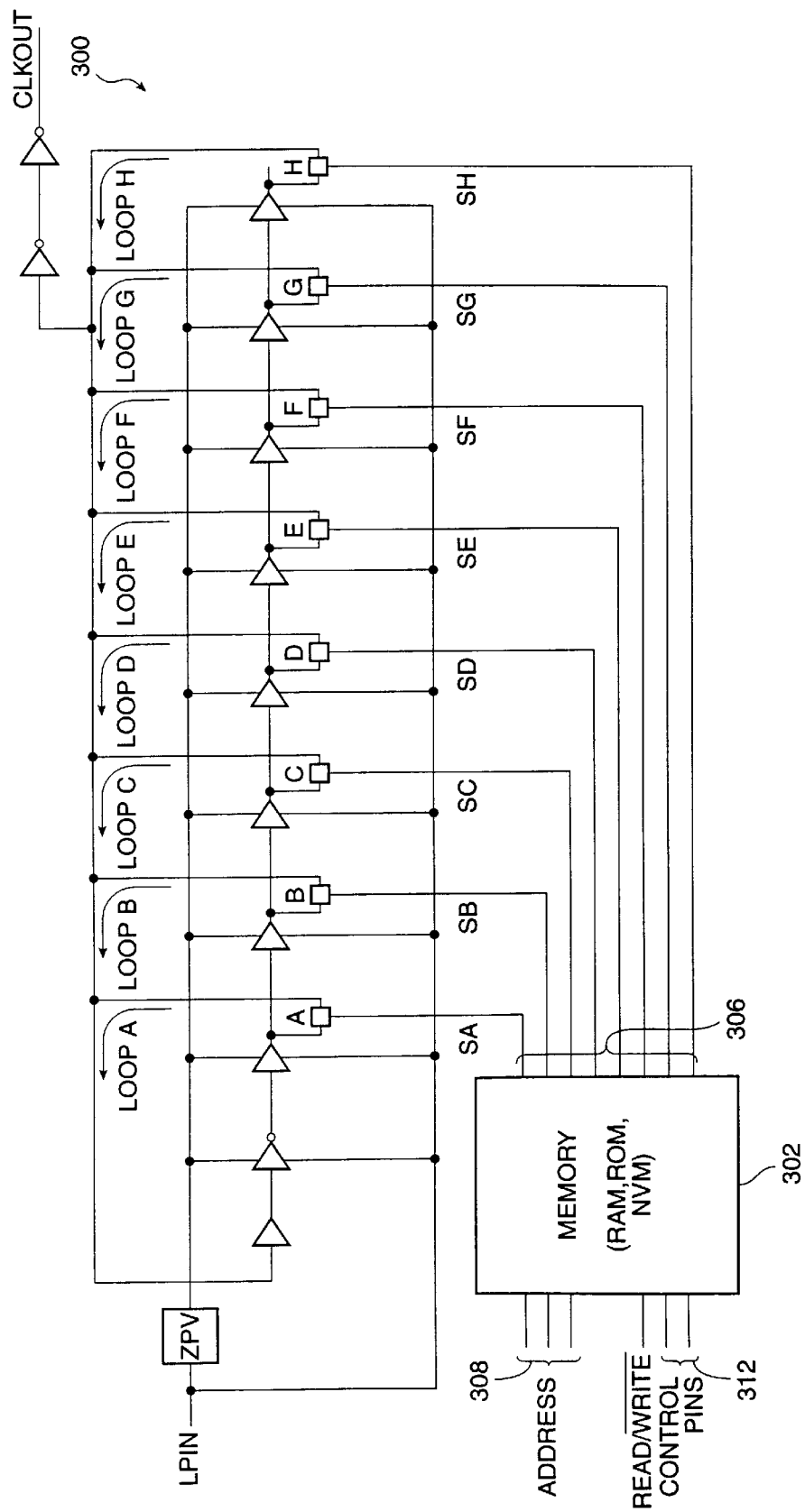
FIG. 5A is a simplified circuit diagram of a memory device used to provide selected signals to an adjustable VCO according to an embodiment of the present invention.

In an alternative embodiment, a memory device 302 according to the present invention supplies switch signals to a VCO 300, as illustrated by FIG. 5A. The outputs 306 of the memory device connect to switches A, B, C, . . . H, and provide signals SA, SB, SC, . . . SH therefor. The memory device includes outputs 306, address lines 308, and control lines 312. Preferably, the number of outputs I/01, I/02, I/On of the memory device is equal to or larger than the amount of switches A, B, C, . . . H. The use of such memory device allows for programmability of the VCO by way of the VCO switches. The memory device may include a dynamic random access memory (DRAM), a static random access memory (SRAM), a read only memory (ROM), programmable read only memory (PROM), electrically erasable programmable read only memories (EEPROM), non-volatile memories, and others. Of course, the type of memory device used depends upon the particular application.

The memory device provides switch signals to program the VCO in a similar way as the previous embodiment. For instance, a desired center frequency is obtained by selecting the appropriate delay loop, e.g., A, B, C, . . . etc. The appropriate delay loop is selected by providing certain output at the I/O's of the memory device. This occurs by selecting the appropriate address lines and control lines of the memory device. Selection of the appropriate address and control lines will depend upon the particular memory device being used.

Figure 5B:
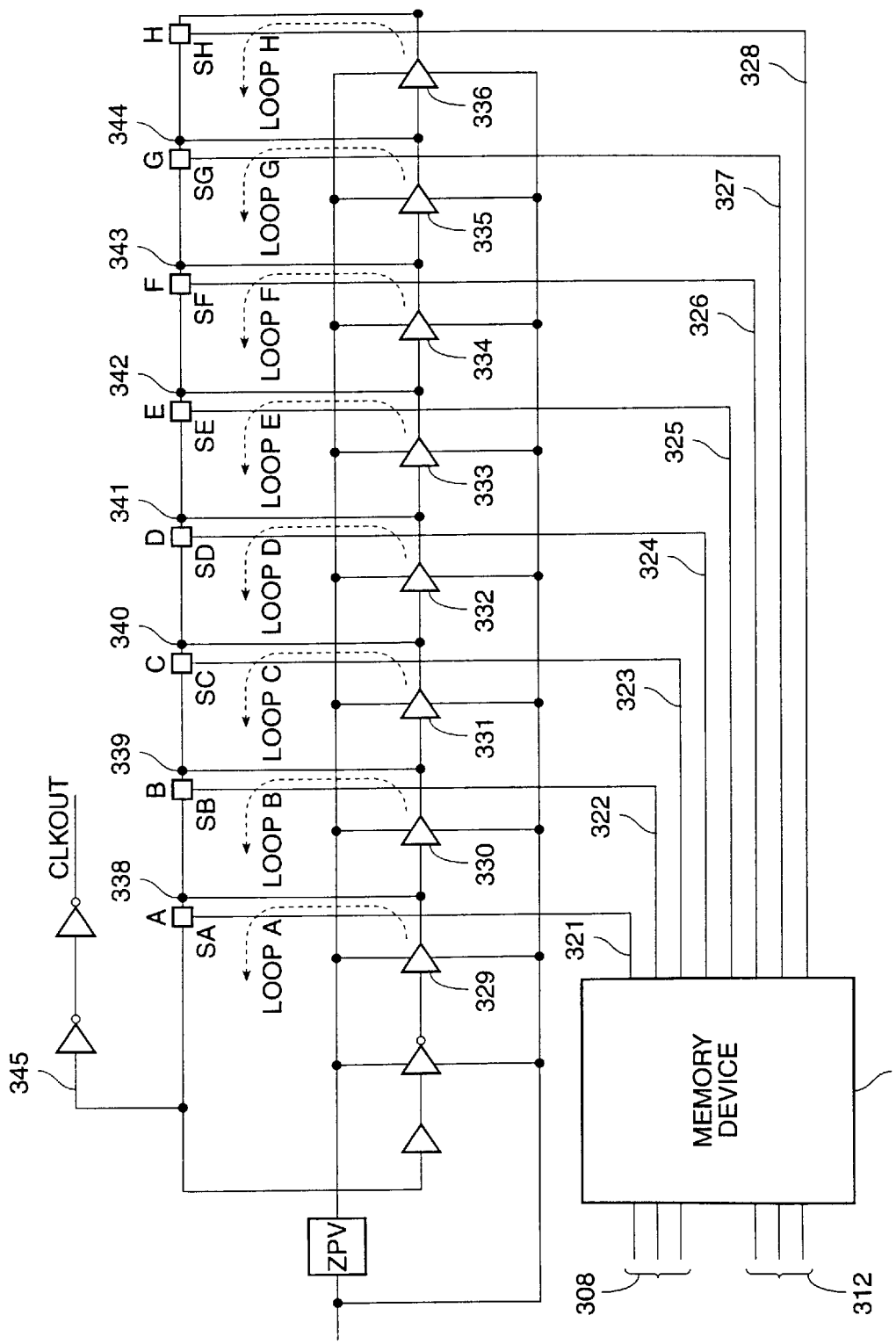
FIG. 5B is a simplified circuit diagram of a memory device used to provide selected signals to an adjustable VCO according to another embodiment of the present invention.

FIG. 5B is a simplified diagram of still a further embodiment 320 of a memory device, which supplies switch signals to the VCO. This embodiment is merely an example, and can be provided in any of the embodiments in this application. This embodiment includes the memory device 302, which has address lines 308 and control lines 312. In addition, the memory device includes output lines 321, 322, 323, 324, 325, 326, 327, 328, and others, if necessary. Output line 321 is connected to switch A, which opens (i.e., open circuit) or closes (i.e., short circuit) loop A. Similarly, lines 322, 323, 324, . . . etc. are connected to switches B, C, D, . . . etc., respectively.

In operation, loop A is selected by closing switch A (i.e., short circuit), which is derived from a signal at line 321. The clock signal is then derived from voltage-controlled inverter 329, which forms loop A by the connection to the line at node 338. The output clock signal is derived from the line after switch A at line 324. The remaining switches B, C, D, . . . etc. are open (i.e., open circuit) to provide isolation to loop A. By keeping the remaining switches keep the line opened, the center frequency using loop A is provided and maintained without any parasitic noise or interference from the remaining circuit elements, including those attached to nodes 338, 339, 340, 341, 342, 343, 344, and others.

Similarly, loop B is selected by closing switches A and B (i.e., short circuit), while opening the switches C, D, E, . . . etc. The clock signal is derived from voltage-controlled inverter 330, which is connected in series with voltage-controlled inverter 329. The clock output is connected to the line at node 339, which is isolated from the remaining circuit elements via switch C. By keeping at switches A and B closed, the center frequency using loop B is provided and maintained without any parasitic noise or interference from the remaining circuit elements, including those attached to nodes 339, 340, 341, 342, 343, 344, and others.

Furthermore, loop F is selected by closing switches A, B, C, D, E, and F, and keeping switches G and H opened. Similarly, any desired center frequency or loop can be selected simply by opening the desired switches and keeping others closed. By way of this embodiment, the center frequency is provided and maintained without any parasitic noise or interference from the remaining circuit elements. This occurs by opening switches (i.e., open circuit) which attach to other parts of the VCO that are not being used, but tend to load down the active parts of the VCO.

In the aforementioned embodiment with RAM, various programs may be stored into memory cells and accessed according to the particular application. Typically a switch sequence in the RAM is downloaded from a hard drive, floppy drive, or another memory means into the RAM memory cells. An n-bit sequence serves as an address of the memory device, and the memory device includes a corresponding m-bit output. A selected m-bit sequence of output signals open and close selected switches A, B, C, . . . H at the VCO to adapt the VCO center frequency to a desired output. Various programs can be selected and used to adjust the VCO center frequency. Of course, the particular programming sequence used depends upon the application.

Figure 6:
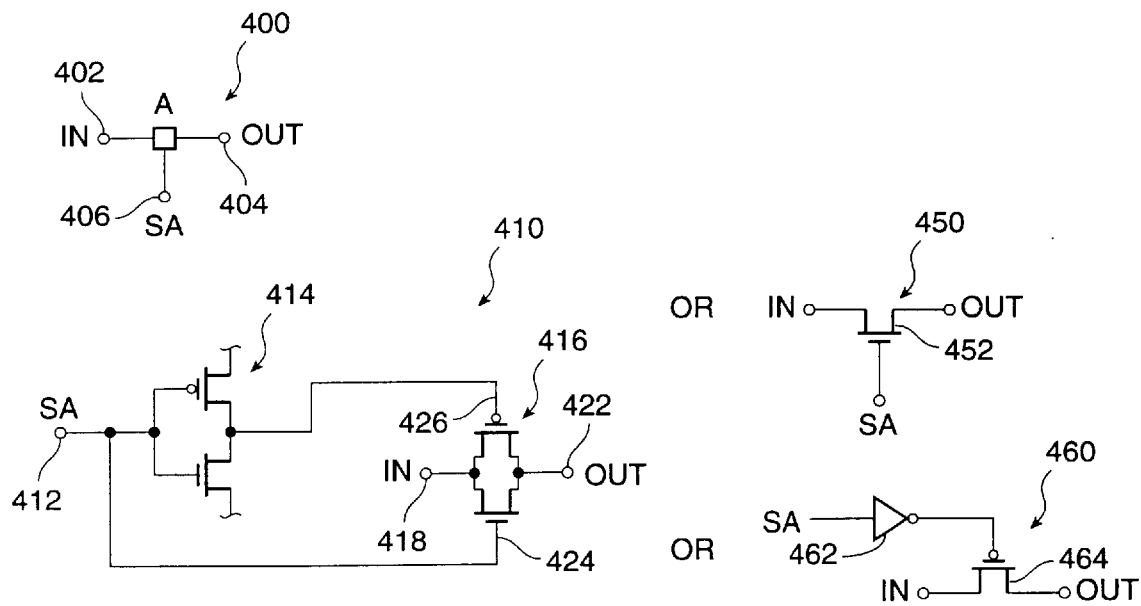
FIG. 6 illustrates simplified circuit diagrams of CMOS switches according to the present invention.

In a CMOS embodiment, switch A is shown by way of simplified circuit diagrams as illustrated by FIG. 6. For example, switch A includes an input 402, an output 404, and a gate terminal 406. The gate terminal is controlled by signal SA. At least three types 410, 450, and 460 of CMOS circuits may be used as the switch. In an embodiment, the switch may be a transmission gate switch 410, an n-pass gate switch 450, or a p-pass gate switch 460.

The transmission gate switch 410 includes an input 412 for switch signal SA, a CMOS inverter 414, a CMOS gate switch 416, an input 418, and an output 422. The SA is connected to an input on the CMOS inverter 414 and a gate of an NMOS transistor 424 of the CMOS gate switch. An output from the CMOS inverter is connected to a gate of a PMOS transistor 426 of the CMOS gate switch. The input 418 is coupled to source/drain regions of both the NMOS and PMOS transistors, and the output 422 is coupled to source/drain regions of both the NMOS and PMOS transistors, as shown.

As for the n-pass 450 and p-pass 460 gates, they are both configured in a suitable manner as illustrated. For the n-pass gate, the SA is connected to a gate of the NMOS transistor 452, and the input and output are connected to each of their respective source/drain regions. In the p-pass gate 460, the SA is connected to an input of a CMOS inverter 462. An output of the CMOS inverter is connected to a gate of a PMOS transistor 464. An input and an output are connected to each of their respective source/drain regions.

The above embodiments are made for easily programming the center frequency of the VCO. In particular, the VCO can be programmed using a memory device, a shift register, or any other device having memory characteristics. The embodiments above also can be made using an isolation feature, which separates active circuit elements of the VCO from inactive circuit elements. These advantages and others are easily implemented using the concepts described above.

Present PLL Layout Embodiments

Figure 7:
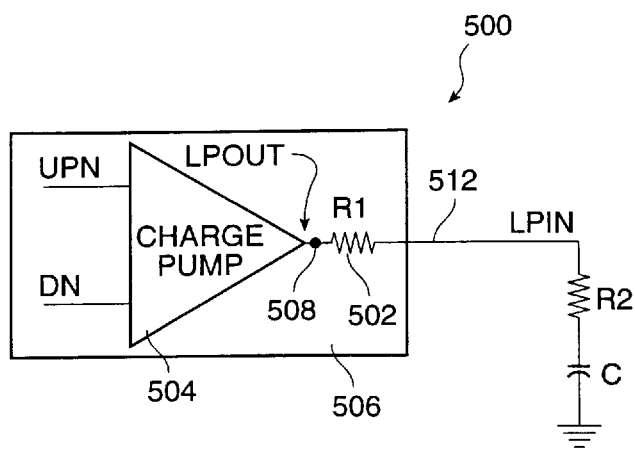
FIG. 7 illustrates a charge pump integrated with R1 in a PLL according to the present invention.

In a specific embodiment, a charge pump is integrated with R1 in a single chip 500 design as illustrated by FIG. 7. The resistor R1 502 is integrated with the charge pump 504, all on a single integrated circuit chip 506. In the loop filter, the resistor R2 and the capacitor C are still outside the integrated circuit chip. In this embodiment, LPOUT becomes an internal node 508, and LPIN is an external pin 512. The external pin is a single pin connected at Y saving at least one external pin. Y connects to external resistance R2 and capacitance C1. The resistance R1 includes a resistance value of about 10 ohms to about 500 kilo-ohms, and is preferably about 5 kilo-ohms and less. Of course, the amount of resistance employed depends upon the particular application.

In a CMOS gate array, the charge pump and the resistor R1 are defined on a single integrated circuit chip, and are fabricated by way of selected fabrication methods. For example, the resistor may be fabricated from an N+ or a P+ diffusion regions, a doped polysilicon strip, a silicide strip, or the like. The resistor is connected to an output of the charge pump by a conducting layer such as metal silicide, polysilicon, aluminum, titanium, and the like.

Figure 8:
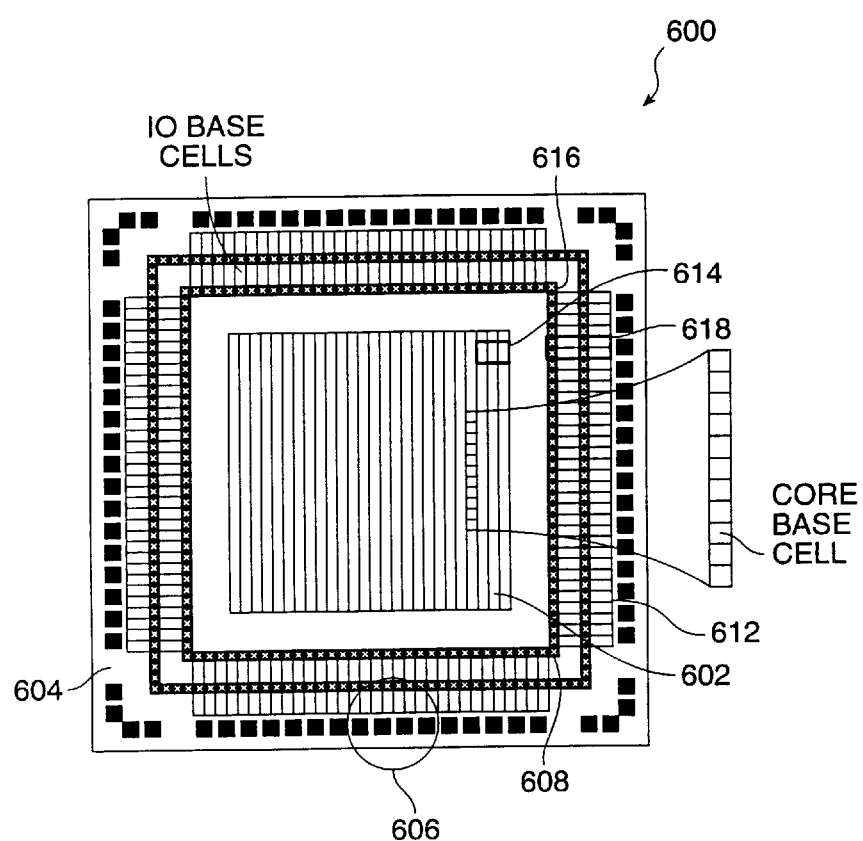
FIG. 8 is a simplified top-view diagram of an integrated circuit chip layout according to the present invention.

A further embodiment of the present invention which reduces noise from a charge pump is illustrated by a simplified top-view diagram of an integrated circuit chip in FIG. 8. The present integrated circuit chip is an application specific integrated circuit (ASIC). The present ASIC is a CMOS type device which includes a CMOS core region 602 and a peripheral region 604. The peripheral region includes multiple bond pads 606, a separate power bus ring structure 608, and an input/output region 612. As shown, the multiple bond pads define $V_{DD}$ pads, $V_{SS}$ pads, and input/output pads.

In an embodiment, the power and/or ground lines for the charge pump are separated from the power and/or ground lines for a VCO and a phase detector. Alternatively, the charge pump is placed some distance away from the VCO and the phase detector for the purpose of isolation preferably to noise. In a preferred embodiment, the VCO 614 and the phase detector 616 are placed inside the core region 602 of the gate array, but the charge pump 618 is defined in the peripheral I/O region 604. The distance from either the VCO and phase detector to the charge pump ranges from about 100 to about 1,000 $\mu$m, and is preferably more than about 800 $\mu$m.

Figure 9:
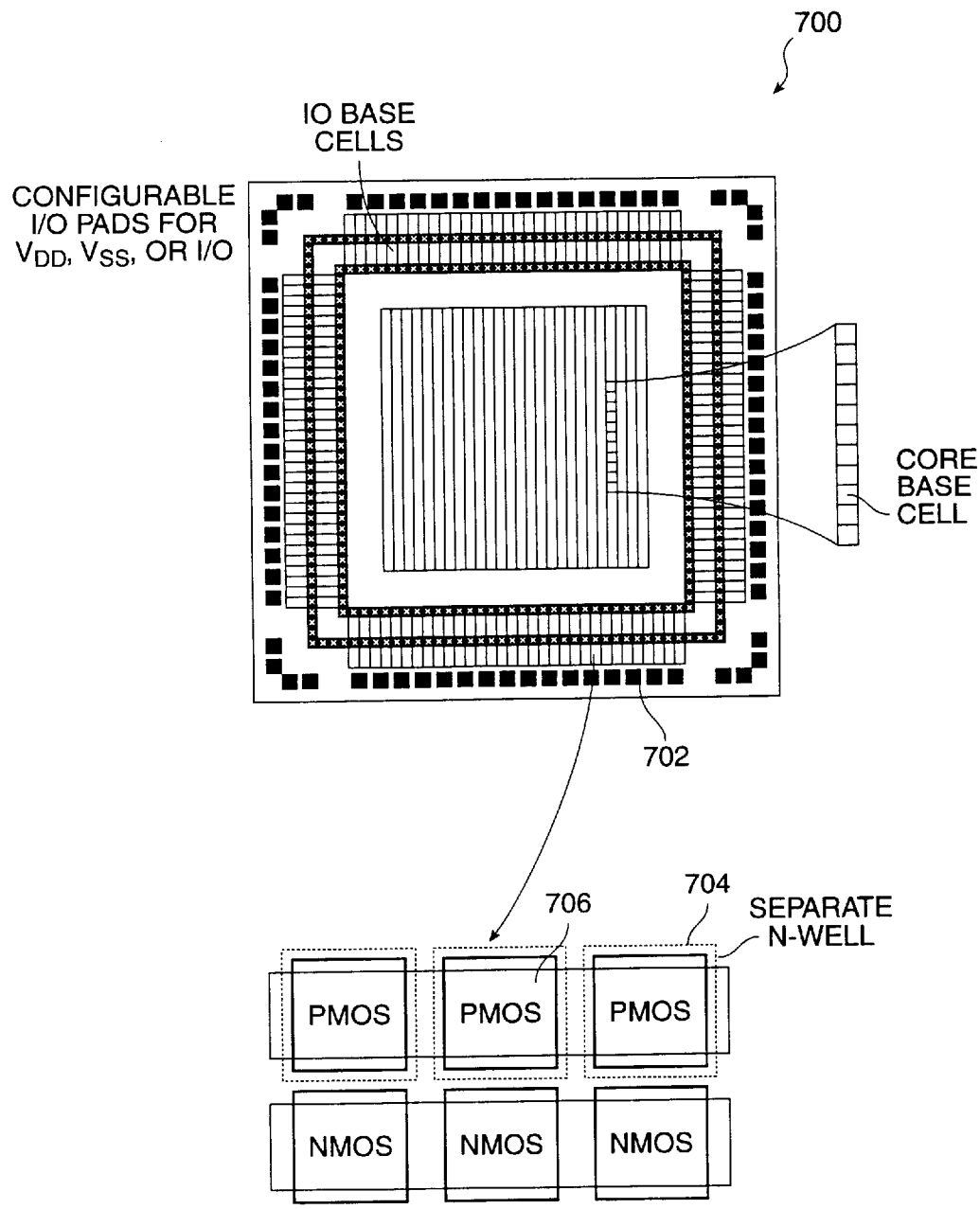
FIG. 9 is a simplified top-view diagram of an alternative embodiment of an integrated circuit chip layout according to the present invention.

In an alternative embodiment, an isolated power bus structure 702 for a PLL is defined over isolated I/O cells as illustrated in FIG. 9. The resistor R1 is attached external to the PLL elements. The isolated I/O cells include a separate N-type well 704 for each of the PMOS devices 706, thereby reducing the influence of noise from adjacent output drivers and the like. The isolated power bus structure also reduces noise from adjacent output drivers onto two nodes defined as LPIN and LPOUT of the PLL. LPIN is coupled (or directly connected) to an input of the VCO, and LPOUT is coupled (or directly connected) to an output of a charge pump.

In a modification to the preceding embodiment, the resistor R1 can be integrated in a single integrated circuit chip with the PLL elements using separate and even isolated power and ground lines for the charge pump and other I/O circuits to further reduce noise. Each I/O circuit is defined in an isolated n-well, as illustrated by FIG. 9. The P-type channel transistors of the charge pumps and adjacent output buffers are defined within the isolated N-type wells, which are each connected to separate power lines. By way of this embodiment, noise interference from adjacent output buffers to the charge pump and to the LPIN node (an input to the VCO) can be further reduced.

Present Embodiments With Reduced SSO Noise

A further alternative embodiment provides an efficient layout of power and ground pads near PLL circuits such as a charge pump, a VCO, and a phase detector. In particular, the embodiment reduces an SSO current limit near PLL circuits. In one embodiment, pads closer to the PLL circuits generally include lower drivability that pads further away from the PLL circuit for embodiments having differing drivability at differing pads. In embodiments where the pads have similar drivabilities, the number of pads near the PLL circuits will be less than those pads further away from the circuit, which reduces the amount of total current near the PLL circuits. Of course, other configurations also can be used depending upon the application.

Figure 10:
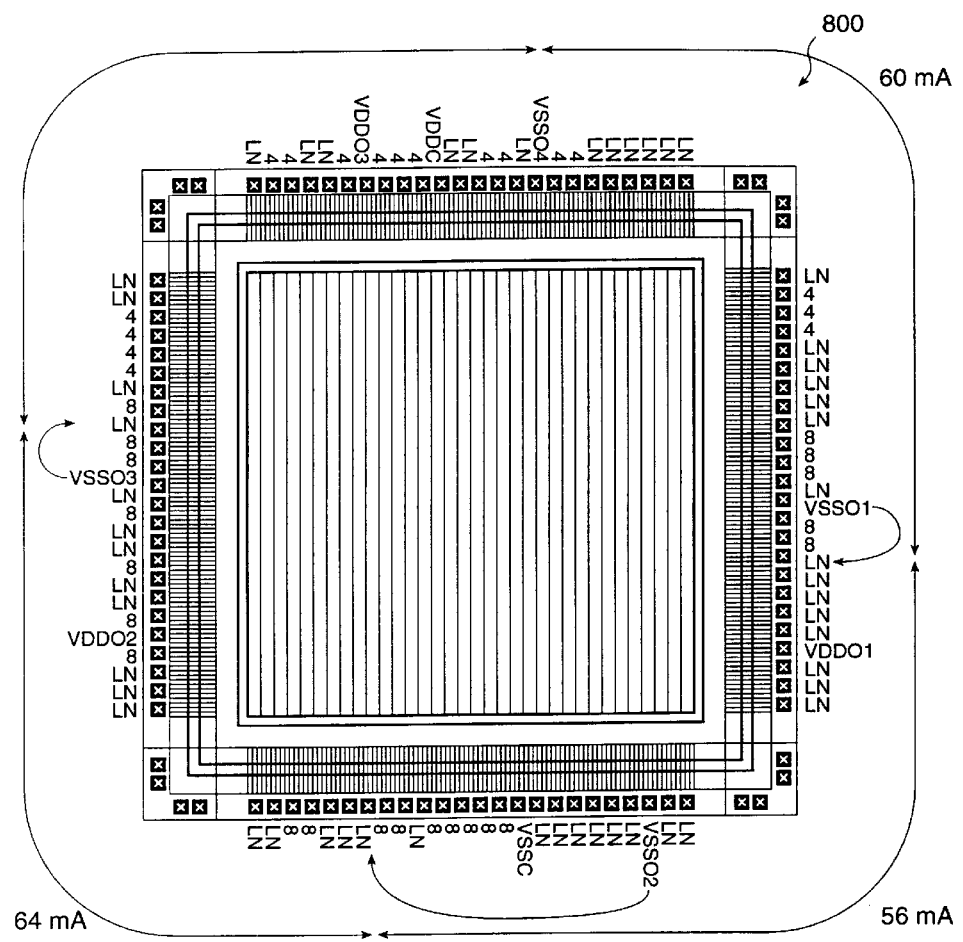
FIG. 10 is a simplified top-view diagram of a further alternative embodiment of an integrated circuit chip layout according to the present invention.

Before a discussion of details to the present embodiments, an overview of conventional SSO rules shall be briefly outlined in reference to FIG. 10. FIG. 10 illustrates a simplified top-view diagram 800 of a conventional ASIC device. The conventional ASIC includes certain rules often called SSO rules to determine an upper current limit on the total simultaneous switching current of output buffers near a power pad (or pin) or a ground pad (or pin). The upper current limit is defined as an SSO current limit. If the summation of output buffer currents exceeds the SSO current limit, the conventional ASIC circuit needs additional power and ground pins. Accordingly, a larger current typically relates to a use of additional power and ground pins.

For example, a conventional SSO current limit for a ground pin is about 60 mA, which is a summation of steady state currents IOH or IOL in an output buffer supplied by a particular ground pin. If a total output buffer steady-state current is about 240 mA, then at least 4 ground pins (each at about 60 mA) are required, and appropriately spaced to evenly support currents at the output buffers. The conventional power/ground pins distribute over a semiconductor chip such that between two power (or ground) pins, the sum of steady-state output currents in output buffers which simultaneously switch do not exceed a designated power (or ground) SSO current limit. Typically, certain SSO current limits for ground and power pins exist for each technology.

In a specific embodiment, a CMOS gate array includes selected SSO limits to reduce PLL frequency jitter. An SSO limit for pins geometrically closest to a PLL circuit is set at X mA, and an SSO limit for pins geometrically farthest away from the PLL circuit is set at Y mA. A value of X is less than a Y value. Y may be a conventional SSO current limit when no PLL circuit is implemented, and X is a smaller SSO current limit to reduce any PLL frequency jitter. A ratio Y to X ranges from about 2 to 5, and is preferably about 3. Of course, the exact ratio used depends upon the particular application.

An alternative specific embodiment relies upon a constant SSO current limit X throughout the entire integrated circuit chip. In this embodiment, X ranges from about 20 to about 50 mA, and is preferably about 40 mA or less. The ratio of X to a conventional SSO current limit is about 30% to about 90%, and is preferably about 70%.

A further alternative embodiment increases SSO current limits for pads nearest to a PLL circuit to the pads furthest from the PLL circuit to reduce PLL frequency jitter. The SSO current limits can increase with a linear profile or an exponential profile or a step or multi-step profile or the like, depending upon pin location in relation to PLL location and other factors.

Figure 11:
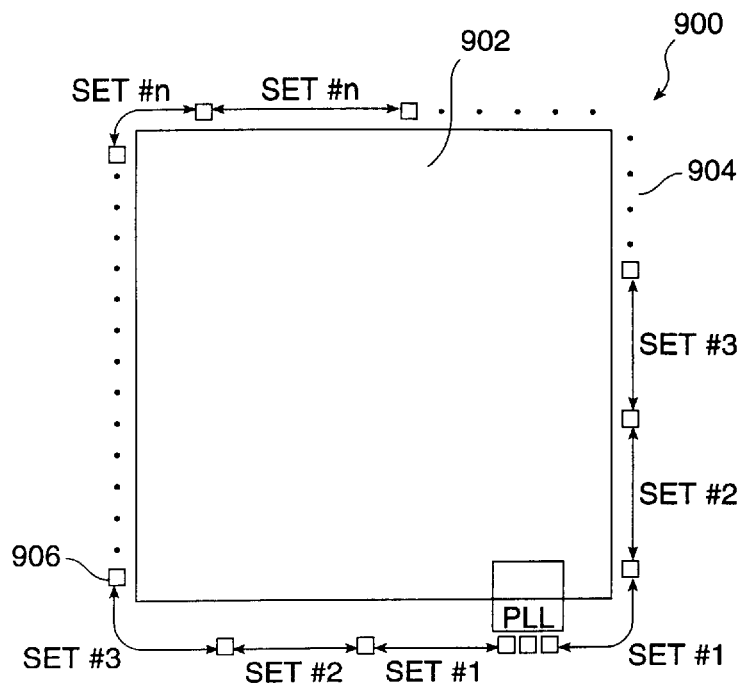
FIG. 11 is a simplified top-view diagram of still a further alternative embodiment of an integrated circuit chip layout according to the present invention.

FIG. 11 is a simplified top-view layout of an integrated circuit chip 900 according to the present invention. The integrated chip is preferably an ASIC which includes a core region 902 and a peripheral region 904. The peripheral region includes a plurality of bond pads 906, each corresponding to an input/output pin or the like. The peripheral region also includes PLL circuits such as a charge pump. Other elements such as a VCO and a phase detector are inside the core. Preferably, the PLL circuit is defined within an isolated N type well, as in the aforementioned embodiment. The peripheral region also defines bond pads (or pins) as sets 1, 2, 3, and n (or groups) depending upon their relative location and function to the PLL circuit. The subsequent embodiments define an SSO current limit for each set of pins, depending upon a selected SSO current limit profile.

Figure 12:
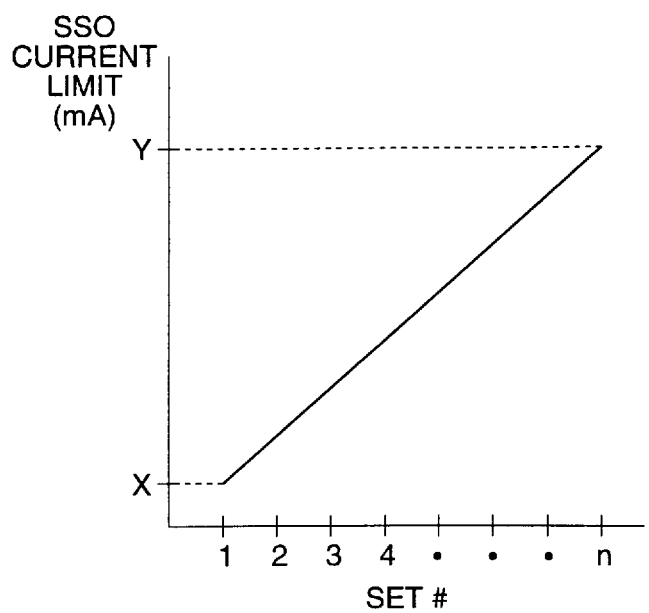
FIG. 12 is a simplified plot of SSO current limits as a function of pin sets for the device of FIG. 11.

In an embodiment, the present invention provides a linear SSO current limit profile as function of pin set as shown in a graph of FIG. 12. The graph illustrates an SSO current limit as a function of pin set numbers 1, 2, 3, 4 . . . n. The relationship between the SSO current limit and the pin set number is linear. The pin sets further away from the PLL circuit have a higher SSO current limit.

For example, an integrated circuit chip has a total output current of about 400 mA. In the linear SSO current limit profile a first SSO current limit for pins closest to the PLL circuit is defined at 20 mA. A second, a third, a fourth, and a fifth SSO current limits are defined at 30 mA, 40 mA, 50 mA, and 60 mA, respectively. A sum of each of the SSO current limits produces a total current output of about 400 mA.

Figure 13:
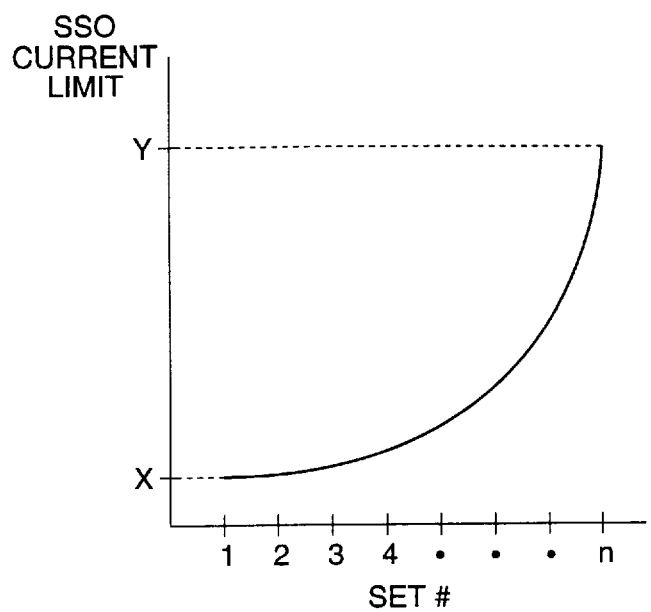
FIG. 13 is a simplified plot of SSO current limits as a function of pin sets for an alternative embodiment of the device of FIG. 11.

In an alternative embodiment, an SSO current limit is a non-linear function with respect to pin set numbers as illustrated by a graph of FIG. 13. As shown, an SSO current limit increases at a slower rate for the pin set numbers closer to the PLL circuit and then increases at a faster rate for the pins further away from the PLL circuit. This embodiment reduces frequency jitter in cases where the pins closer to the PLL circuit tends to influence the PLL circuit in a more significant manner than pins further away from the PLL circuit.

Figure 14:
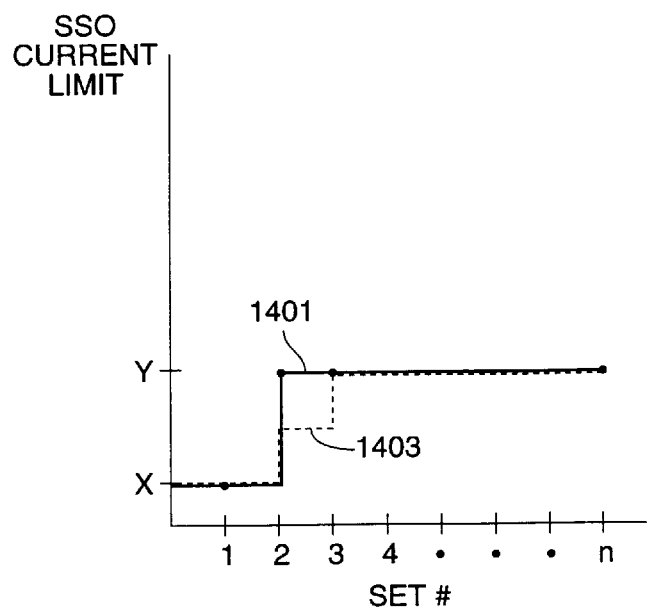
FIG. 14 is a simplified plot of SSO current limits as a function of pin sets for a further alternative embodiment of the device of FIG. 11.

In a further alternative embodiment, an SSO current limit increases in a step-wise manner such as a single step-function 1401 or multistep function 1403 illustrated by a graph of FIG. 14. As shown, a selected number of power (or ground) pins near the PLL circuit are set at a lower SSO current limit X, and a selected number of power (or ground) pins further away from the PLL circuit are set at a higher SSO current limit Y. As previously noted, the ratio Y to X ranges from about 2 to about 5, and is preferably about 3. Of course, the exact ratio used depends upon the particular application. Additionally, the single step-function can be replaced by a multi-step 1403 SSO function or the like.

A further alternative embodiment includes a set of design rules to further reduce the influence of noise from an output driver onto a PLL circuit. A larger driver which is actually a larger buffer or the like is generally further away from the PLL circuit. Examples of distances between a CMOS output buffer and the PLL circuit for selected driving capability are illustrated by Table 1.

TABLE 1

Minimum Distance Between an Output Buffer and PLL

| OUTPUT BUFFER DRIVING CURRENT (mA) | DISTANCE BETWEEN OUTPUT BUFFER AND PLL (microns) |
|---|---|
| 16 | >120 or preferably 300 (or about 5 pads) |
| 12 | >100 or preferably 240 (or about 4 pads) |
| 8 | >80 or preferably 180 (or about 3 pads) |
| 4 | >60 or preferably 120 (or about 2 pads) |
| 2 | >60 or preferably 120 (or about 2 pads) |

An on-chip PLL tends to operate with reduced influences of noise from an output buffer by way of the design rules as illustrated above.

While the above is a full description of the specific embodiments, various modifications, alternative constructions, and equivalents may be used. For example, while the description above is in terms of a gate array and in particular a CMOS gate array it would be possible to implement the present invention with other cell-based or standard cell or full-custom designs. Such designs may employ technology including MOS, bipolar, biCMOS, among others.

Therefore, the above description and illustrations should not be taken as limiting the scope of the present invention which is defined by the appended claims.

What is claimed is:

1. A method for setting a simultaneous switching operating (SSO) limits for an application specific integrated circuit (ASIC) comprising a phase-locked loop (PLL) therein, said method comprising:

defining a first set of pins adjacent to a PLL circuit in an ASIC and defining a second set of pins adjacent to said first set of pins; and setting a first SSO current limit for each of said first set of pins and setting a second SSO current limit for each of said second set of pins;

wherein said first SSO current limit is less than said second SSO current limit.

2. The method of claim 1 wherein said first SSO current limit to said second SSO current limit ratio ranges from about 2 to about 5.

3. The method of claim 1 wherein said first SSO current limit to said second SSO current limit ratio is about 3 and less.

4. The method of claim 1 wherein said first SSO current limit increases linearly to said second SSO current limit.

5. The method of claim 1 wherein said first SSO current limit increases at a step up to said second SSO current limit.

6. The method of claim 1 wherein said first SSO current limit increases exponentially to said second SSO current limit.

7. The method of claim 1 further comprising a step of identifying an output buffer comprising a driving current of about 16 mA and defining such output buffer at about 120 microns and greater from said PLL circuit.

8. The method of claim 1 further comprising a step of identifying an output buffer comprising a driving current of about 12 mA and defining such output buffer at about 100 microns and greater from said PLL circuit.

9. The method of claim 1 further comprising a step of identifying an output buffer comprising a driving current of about 8 mA and defining such output buffer at about 80 microns and greater from said PLL circuit.

10. The method of claim 1 further comprising a step of identifying an output buffer comprising a driving current ranging from about 4 mA to about 2 mA and defining such output buffer at about 60 microns and greater from said PLL circuit.

* * * * *